United States Patent
Chou et al.

(10) Patent No.: US 7,510,946 B2
(45) Date of Patent: Mar. 31, 2009

(54) METHOD FOR FILLING OF NANOSCALE HOLES AND TRENCHES AND FOR PLANARIZING OF A WAFER SURFACE

(75) Inventors: Stephen Y. Chou, Princeton, NJ (US); Bo Cui, Boucherville (CA); Christopher F. Keimel, Schenectady, NY (US)

(73) Assignee: Princeton University, Princeton, NJ (US)

( * ) Notice: Subject to any disclaimer, the term of this patent is extended or adjusted under 35 U.S.C. 154(b) by 160 days.

(21) Appl. No.: 11/533,323

(22) Filed: Sep. 19, 2006

(65) Prior Publication Data
US 2007/0082457 A1    Apr. 12, 2007

Related U.S. Application Data

(63) Continuation-in-part of application No. 10/390,406, filed on Mar. 17, 2003, now Pat. No. 7,211,214.

(51) Int. Cl.
    *H01L 21/3105* (2006.01)
(52) U.S. Cl. .................. 438/424; 438/428; 438/436; 438/438; 438/589; 257/E21.141; 257/E21.546; 427/97.2; 427/554
(58) Field of Classification Search .................. 438/427, 438/428, 424, 436, 438, FOR. 227, 589; 257/E21.241, E21.546; 427/553, 554, 97.2
    See application file for complete search history.

(56) References Cited

U.S. PATENT DOCUMENTS

| | | | |
|---|---|---|---|
| 5,772,905 A | | 6/1998 | Chou |
| 6,190,929 B1 | | 2/2001 | Wang et al. |
| 6,309,580 B1 | | 10/2001 | Chou |
| 6,387,504 B1 | * | 5/2002 | Mushovic .................. 428/413 |
| 6,472,029 B1 | * | 10/2002 | Skszek ........................ 427/554 |
| 6,581,280 B2 | * | 6/2003 | Curcio et al. ................. 29/832 |
| 6,984,346 B2 | * | 1/2006 | Hayashi ..................... 264/1.32 |
| 7,137,803 B2 | * | 11/2006 | Chou ....................... 425/405.1 |
| 2003/0054158 A1 | * | 3/2003 | Smith et al. ................. 428/323 |
| 2006/0110545 A1 | * | 5/2006 | Toyoda ....................... 427/554 |
| 2007/0082457 A1 | * | 4/2007 | Chou et al. ................ 438/427 |
| 2007/0182060 A1 | * | 8/2007 | Cavallini et al. ........... 264/239 |
| 2008/0043334 A1 | * | 2/2008 | Itzkovitch et al. ........... 359/569 |

FOREIGN PATENT DOCUMENTS

| | | |
|---|---|---|
| EP | 1072954 | 1/2001 |
| WO | 9964642 | 12/1999 |
| WO | 02077716 | 10/2002 |

* cited by examiner

*Primary Examiner*—George Fourson
(74) *Attorney, Agent, or Firm*—Polster, Lieder, Woodruff & Lucchesi, LC

(57) ABSTRACT

A processing method for use in the fabrication of fabrication of nanoscale electronic, optical, magnetic, biological, and fluidic devices and structures, for filling nanoscale holes and trenches, for planarizing a wafer surface, or for achieving both filling and planarizing of a wafer surface simultaneously. The method has the initial step of depositing a layer of a meltable material on a wafer surface. The material is then pressed using a transparent mold while shining a light pulse through the transparent mold to melt the deposited layer of meltable material. A flow of the molten layer material fills the holes and trenches, and conforms to surface features on the transparent mold. The transparent mold is subsequently removed.

28 Claims, 6 Drawing Sheets

250 nm Si on 250 nm high grating

US 7,510,946 B2

METHOD FOR FILLING OF NANOSCALE HOLES AND TRENCHES AND FOR PLANARIZING OF A WAFER SURFACE

CROSS-REFERENCE TO RELATED APPLICATIONS

The present application is a continuation-in-part of co-pending U.S. patent application Ser. No. 10/390,406 filed on Mar. 17, 2003, herein incorporated by reference.

STATEMENT REGARDING FEDERALLY SPONSORED RESEARCH

Not Applicable.

BACKGROUND OF THE INVENTION

The present disclosure is related generally to methods for the preparation of a wafer surface, and in particular, to methods for the processing of nanostructures, for filling nanoscale holes and trenches, for removing voids in the fillings, and for planarizing a wafer surface Both filling of nanoscale hole and trenches, and the planarizing of wafer surfaces are very important steps in integrated circuit fabrication, as well as in other nanoscale devices manufacturing. Currently, the filling of via holes and trenches is by chemical vapor deposition (CVD), physical depositions (such as sputtering, evaporation), atomic layer deposition (ALD), and chemical fluid deposition (CFD), etc. For example, in the CVD metal plug process for the interconnects of integrated circuits, the via holes and trenches are etched in a dielectric material, and subsequently filled up with a metal. Clearly, any voids left in the via holes or trenches caused by poor step coverage will create a serious problem for the interconnects. The step coverage of tungsten CVD is still limited by the low volatility of the precursor gas WF6 that leads to a low vapor pressure. The result is a mass transport limited deposition rate, and the hole openings receive faster deposition and may be closed before the volume of the holes are completely filled. Another disadvantage of CVD is its relatively high thermal budget.

Atomic layer deposition can achieve excellent step coverage in certain conditions. It is a modified form of CVD with gas precursors introduced one at a time and pump/purge in between, so that a film is deposited at the rate of one atomic layer per cycle, with a typical deposition rate of order 0.5 nm/min. Not only is the slow deposition rate a manufacturing issue, but also in ALD, voids may be formed if the via holes or trenches have sidewalls with negative angles.

Another candidate for filling future high aspect ratio via holes and trenches is chemical fluid deposition (CFD) which uses supercritical fluids like $CO_2$ as a carrier for organometallics. As the supercritical fluid $CO_2$ retains its gas nature and can flow into deep holes, the material deposition rate is limited by chemical reaction rate, giving conformal step-coverage. The drawbacks of CFD include high process pressure on the order of 100 bar, and limited choices of precursors having high solubility in the supercritical fluid. Moreover, like ALD, voids may be formed when via holes or trenches have negative sidewall angles.

In wafer planarization a traditional approach is to utilize a chemical mechanical polishing (CMP) method where chemical slurry is deposited on a wafer surface and subsequent polishing removes any non-flatness of the wafer. The process is messy, generating significant chemical and water waste.

Therefore, there is still a need for a new method capable of filling nanoscale via holes and trenches having high aspect ratios, regardless of the sidewall angles, and which has a high throughput. Similarly, there is a need for an efficient and clean method for wafer surface planarization.

BRIEF SUMMARY OF THE INVENTION

Briefly stated, the present disclosure provides methods that fill via holes and trenches having nanoscale openings and high-aspect-ratios, and which will planarize a wafer surface. In the method, a filling material (e.g. metals or Si) is first deposited onto the nanoscale via holes and trenches by a deposition method. The deposition may have poor step coverage and hence fills the holes partially and creates voids; or it may have good coverage and fill the via holes and trenches. In either case, after the deposition a mirror-flat transparent plate (mold) is pressed against the substrate, while radiation (e.g. an excimer laser pulse (XeCl, 308 nm wavelength, 20 ns pulse duration) or pulsed lamp) shines through the mold. The radiation melts the filling material, and the flat mold presses the molten materials into the holes, filling them completely without voids. The flat mold also planarizes the wafer surfaces. The methods has been successfully used to fill a hole array having 100 nm diameter, 500 nm depth (aspect ratio 5 to 1) and 200 nm inter-hole spacing (pitch) with e-beam evaporated silicon and copper. Besides superior step coverage and negligible thermal budget, the techniques of the present disclosure are fast, simple, and do not require a seed layer. Furthermore, the method can planarize the wafer surface in addition to filling the holes. This technique can be extended to other materials important for electronics devices and integrated circuits, and will have many applications in optical, magnetic, biological, and nanofluidic devices.

The foregoing features, and advantages set forth in the present disclosure as well as presently preferred embodiments will become more apparent from the reading of the following description in connection with the accompanying drawings.

BRIEF DESCRIPTION OF THE SEVERAL VIEWS OF THE DRAWINGS

In the accompanying drawings which form part of the specification.

Corresponding reference numerals indicate corresponding parts throughout the several figures of the drawings. It is to be understood that the drawings are for illustrating the concepts set forth in the present disclosure and are not to scale.

DESCRIPTION OF THE PREFERRED EMBODIMENT

Figure 1A:
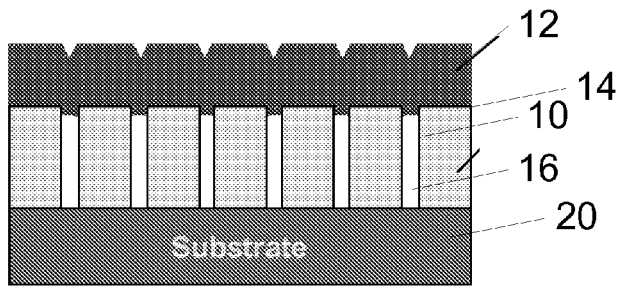
FIGS. 1A through 1D illustrate the sequence of the present invention for filling of via holes and trenches having nanoscale opening and high aspect ratio: (a) material deposition, (b) place a flat mold on top, (c) melting the deposited material using a light pulse while pressing the molten material, and (d) the molten material is pressed into the vias and trenches.
Figure 1B:
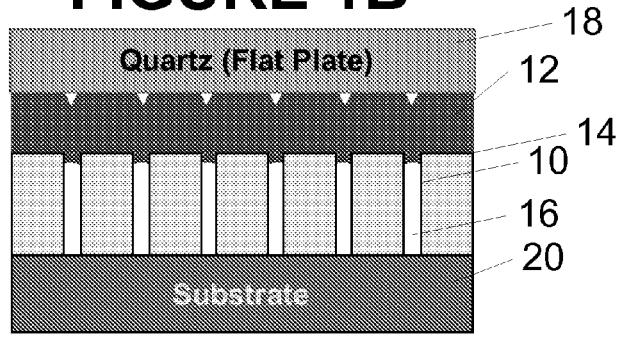
Figure 1C:
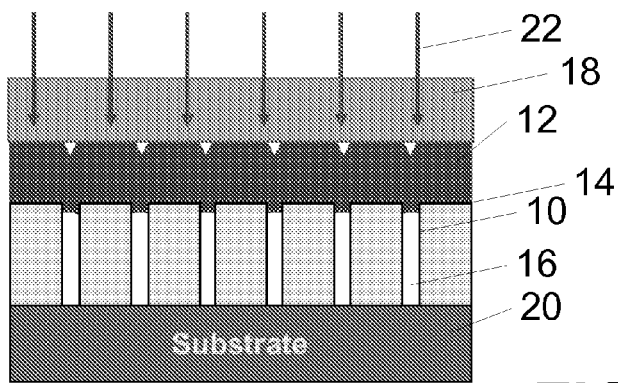
Figure 1D:
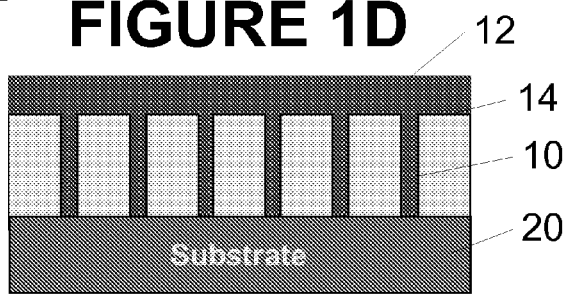
Figure 2A:
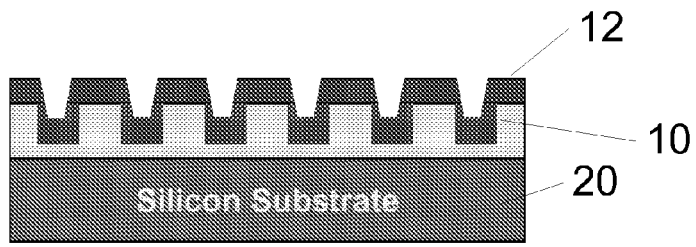
FIGS. 2A through 2D illustrate the sequence of the present invention for planarizing a wafer surface: (a) deposition of a material (optional), (b) place a flat mold on top, (c) melting the deposited material using a light pulse while pressing the molten material, and (d) the molten material is planarized.
Figure 2B:
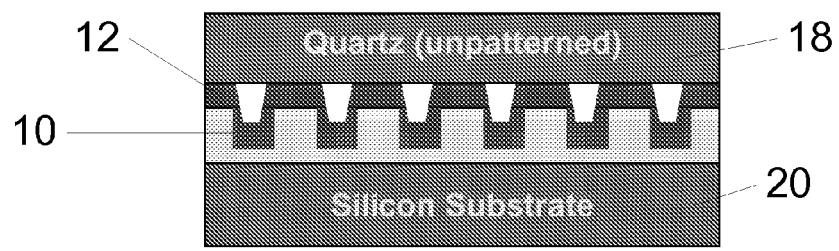
Figure 2C:
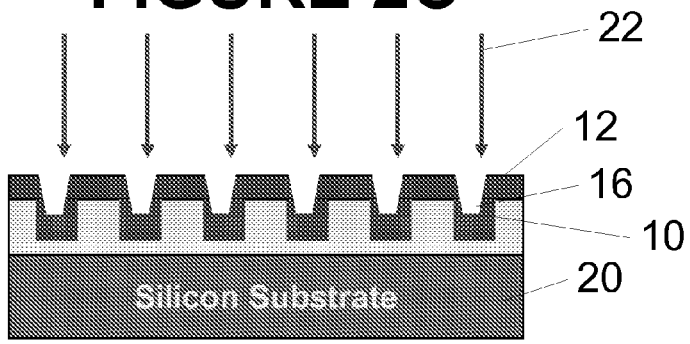
Figure 2D:
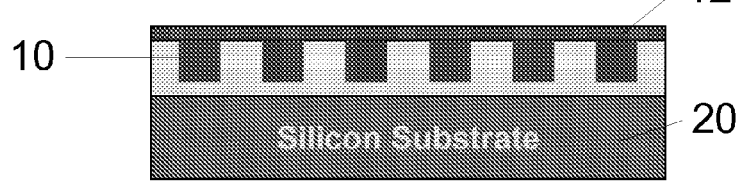

The following detailed description illustrates the invention by way of example and not by way of limitation. The description enables one skilled in the art to make and use the present disclosure, and describes several embodiments, adaptations, variations, alternatives, and uses of the present disclosure, including what is presently believed to be the best mode of carrying out the present disclosure.

Turning to FIGS. 1A-1D and FIGS. 2A-2D, a method of the present invention is a fabrication process that either fills nanoscale holes or trenches 10 with a filling material 12, planarizes a wafer surface 14, or achieves both filling and planarization in the same process. The method first deposit a filling material 12 (e.g. metals or Si) onto the holes and trenches 10 by any conventional deposition method. The deposition may have poor step coverage and hence fills the holes and trenches 10 partially and creates voids 16; or a good coverage and fills the holes and trenches 10 completely. In either case, after the deposition a mirror-flat transparent plate (mold) 18 is pressed against the substrate 20, while a light pulse 22 (e.g. an excimer laser pulse (XeCl, 308 nm wavelength, 20 ns pulse duration) or pulsed lamp) shines through the mold 18. The light pulse melts the filling material 12, and the flat mold 18 presses the molten filing materials 12 into the holes and trenches 10, filling them completely without voids. The flat mold 18 also planarize the wafer surfaces 14. To facilitate a filling (such as reduce the needed pressure and enhance adhesion) a thin layer of a wetting material or composite may be deposited onto the sidewall of holes and trenches 10. If only planarization is needed, the deposition process in the above is not necessary, and only the melting and pressing with the mold 18 will be used. In some applications, a uniform etch back will be used to remove certain materials to expose the substrate 20 in certain locations.

The structures that the method can be applied to fill include the holes, trenches, curved patterned, and any patterns that can be generated by a patterning method. The lateral size of the patterns may have a broad range from 1 nanometer to 1 centimeter. The vertical size (i.e. depth) of the patterns is in the range of 1 nm to 1 millimeter.

The materials 12 that may be used to fill a hole or trench 10 or are planarized include metals, semiconductors, dielectrics, their compounds, mixtures or multilayers, and alike. The metals may include gold, copper, aluminium, platinum, silver, magnetic materials, nickel, iron, alloys and composites and alike. The semiconductors may include the elements and compounds from the group IV (e.g Si, Ge, SiGe, SiC), III-V (e.g. GaAs) and II-VI (e.g. CdS, ZnO) of the periodic table. The dielectrics may include silicon dioxide, silicon nitride, many others, and their mixtures and compounds.

While ultraviolet (UV) laser radiation sources are advantageous, depending on the substrate 20, other sources can be used. Infrared lasers can be used to soften or liquefy many metals. Heat lamps of different radiation spectrum also can be used to melt or soften the materials 12 to be filled or planarized. The radiation spectrum of the laser and lamp can vary from the wavelength from 1 nanometer to 100 microns. The pulse duration of the radiation 22 can be selected upon the filling and planarization process. The pulse can be short enough so that the only a surface layer of the substrate 20 is heated, while the rest of the substrate 20, as well as the mold 18 is not heated significantly. Multiple pulses can be used.

The substrate 20 may be formed from a semiconductor, metal or dielectric, their compounds, mixtures, and multilayers.

The mold 18 can be any material harder than a molten fill material 12, including quartz, glass, or other materials which are transparent to the radiation 22, even silicon or semiconductors whose band gap is larger than the radiation 22 of the wavelengths. The thickness of the mold 18 can be as thin as in micrometer or as thick in several millimetres or centimetres.

The optional wetting layer may include metals, dielectrics, and semiconductors, such as titanium, chromium, silicon, etch, depending upon the materials 12 to be filled.

The methods of the present invention may be used to make electronic devices (such as contact holes, contact lines, gates for transistors, microwave antennae, surface acoustic wave devices), optical devices, (such as subwavelength optical elements, filters, polarizarers, waveplates, and photonics crystals), magnetic devices, (such as random access memory, patterned media, quantized magnetic disks where the bits of the devices is very small), biological devices, (such as DNA, protein, virus or other biological analyzing devices), and fluidic devices of different materials needed to fill up certain parts of the trenches of holes.

Figure 3A:
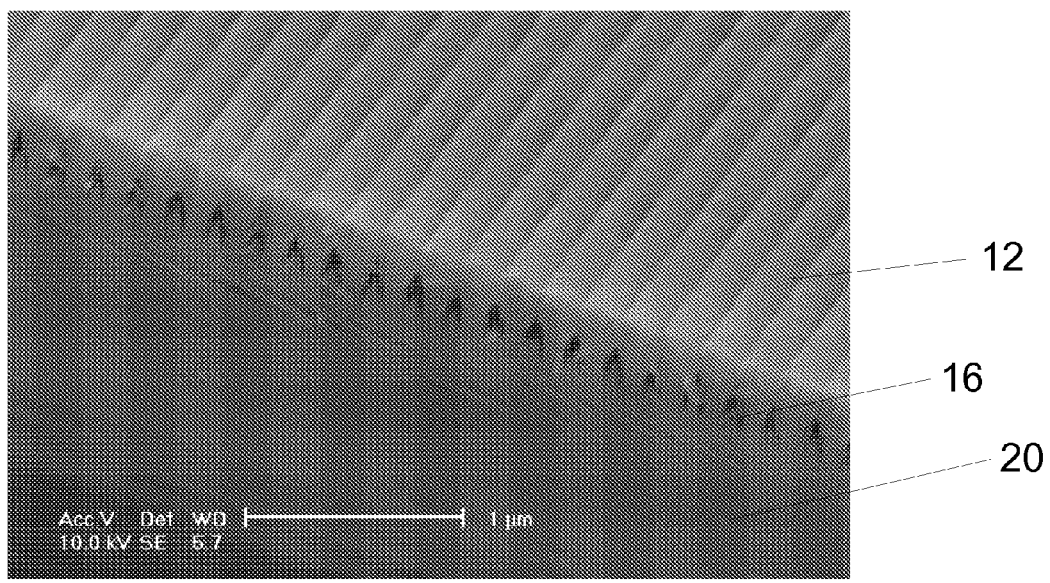
FIGS. 3A and 3B illustrate scanning electron micrographs of (a) SiO2 nanotrench array with a material (silicon) deposited on the top, before the melting and pressing, and (b) after the melting and pressing, the Si filled the SiO2 trenches completely without voids and the top surface is planarized.
Figure 3B:
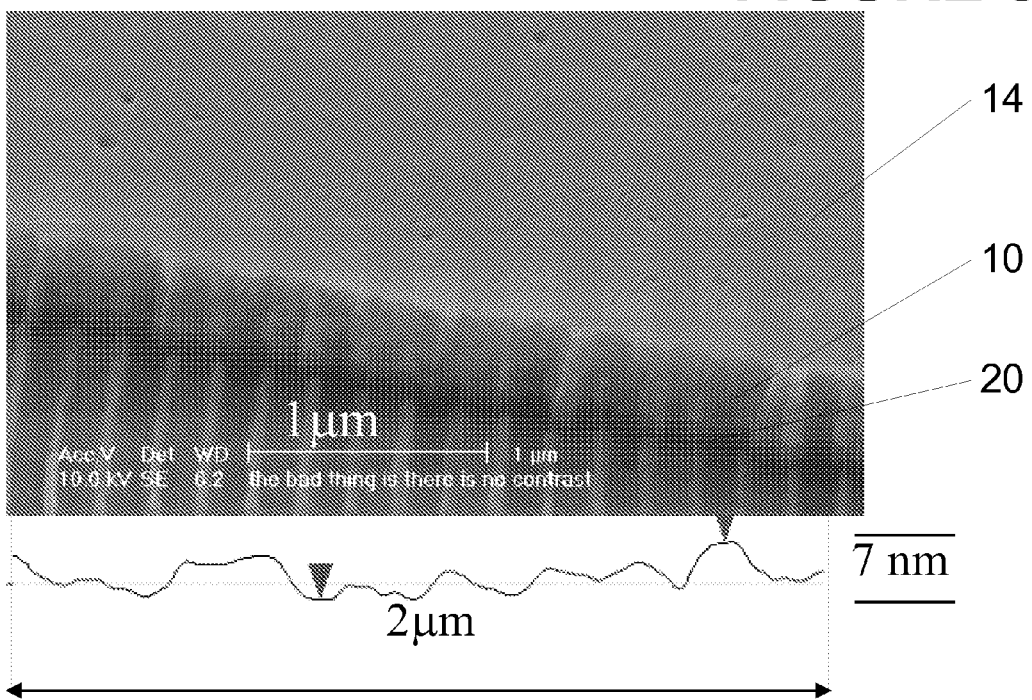
Figure 4A:
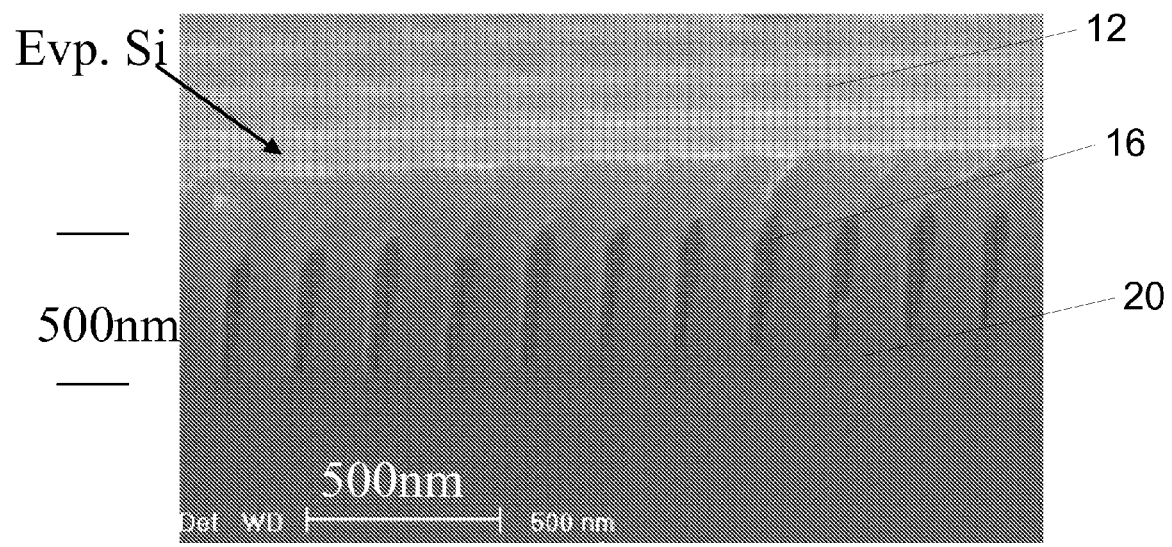
FIGS. 4A and 4B illustrate scanning electron micrographs of (a) SiO2 nano-pillar array with a material (silicon) deposited on the top, before the melting and pressing, and (b) after the melting and pressing, the Si filled the SiO2 pillars and the top surface is planarized, showing all holes were completely filled by α-Si without void. Laser fluence was 1.1 J/cm2.
Figure 4B:
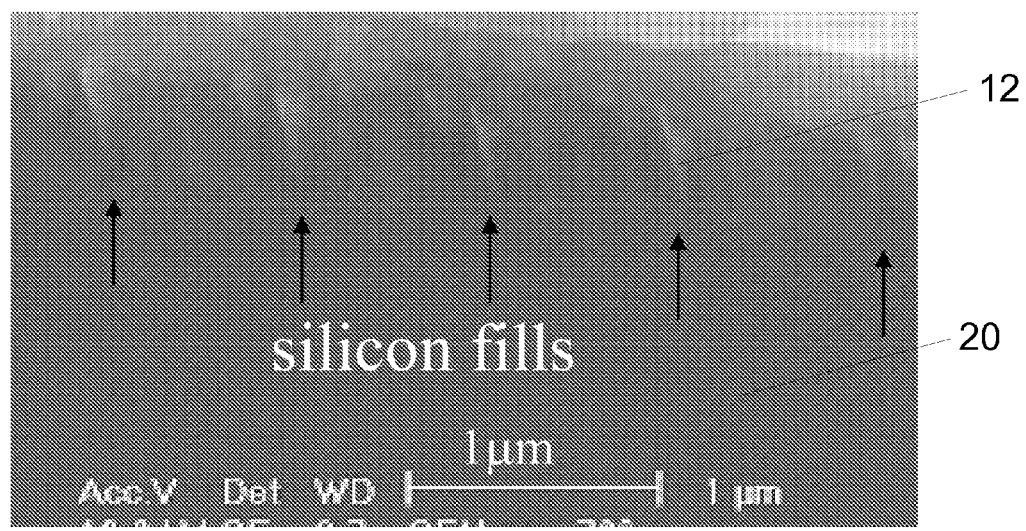

As a first example to demonstrate the method of filling nanoscale via holes 10 by laser assisted direct imprint (LADI), we fabricated in a Si substrate 20, a hole array having 100 nm diameter, 500 nm depth (aspect ratio 5 to 1) and 200 nm inter-hole spacing (pitch). The hole array was patterned by nanoimprint lithography and etched by Cl2/Ar RIE. As silicon was a good heat sink, a 15 nm thermal oxide layer was grown to reduce heat loss to the surrounding bulk Si, and to shrink the hole size at the same time. Finally, 200 nm Si or Cu was deposited on top of the hole array by e-beam evaporation. As expected and shown in FIG. 3A, evaporation deposition has very poor step coverage, so the holes were only partially filled, with the sidewall of the holes receiving little deposition before the hole opening was closed.

During the hole filling by LADI, we pressed a UV grade quartz plate 18 with a mirror flat surface against the substrate 20 coated with the filling material 12, and vacuumed the sample assembly below 200 mTorr. Then a single excimer laser pulse 22 (XeCl, 308 nm wavelength, 20 ns pulse duration, 2.5×2.5 mm2 beam size) of fluence 1.1 J/cm2 melts the filling material 12 momentarily. When in molten state, Si and Cu have very low viscosity (see the next section), so they could flow into the holes 10 and reach the hole bottoms within some 100 ns. FIG. 2 shows via filling by Si, indicating a complete filling without voids 16.

Figure 6:
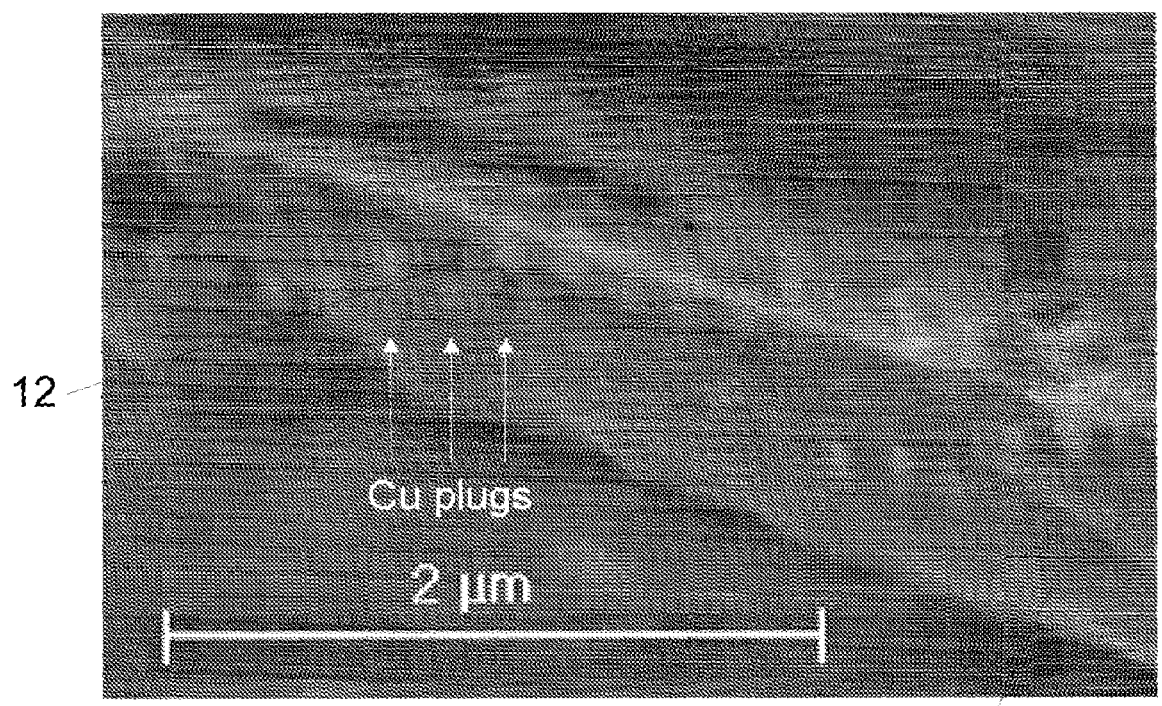
FIG. 6 shows a scanning electron micrograph of a laser-assisted via-hole filling by Cu. The Cu plugs were broken after wafer cut. Laser fluence was 1.1 J/cm2.

For via hole and trench 10 filling by Cu (FIG. 6), the Cu plugs were found broken after wafer cut, and it is possible that the built-in stress caused by fast cooling of the liquid Cu has contributed to the Cu plug fracture. Nonetheless, most holes were completely filled to the bottom, as indicated by the Cu plug sections found on the bottom of the holes.

For both Si and Cu filling, based on the laser fluence and thermal properties of the related materials, the 15 nm SiO$_2$ and a very thin layer of the surrounding Si at the upper part of the hole melted. However, due to the 8-9 orders higher viscosity of SiO$_2$ compared to that of the filling material 12, the flow of the molten SiO$_2$/Si is negligible, leading to no apparent distortion of the holes 10, as evidenced by the regular and distinct shape of the Si and Cu plugs with diameter corresponding to the original hole diameter. On the other hand, the 15 nm thermal SiO$_2$ is much thinner than the characteristic heat diffusion length (see the next section) of 260 nm for SiO$_2$, leading to significant heat loss to the bulk Si. The via hole and trench 10 filling would undoubtedly be greatly facilitated in reality when the via holes and trenches are surrounded by a thick thermal insulator. During the via hole and trench filling by LADI, the wafer surface 14 is planarized due to the low viscosity of the molten fill material 12 and the flat surface of the mold 18.

In the via hole and trench 10 filling process, the driving force is apparently the applied pressure on the mold 18. The counter forces include surface tension, the viscous force and the inertial force. The minimum applied pressure necessary for squeezing the molten material 12 into the holes 10 is determined by the surface tension and has order of $\sigma/\phi$ with $\sigma$ as surface tension and $\phi$ as hole diameter. Liquid Si and Cu has surface tension one order higher than that of water, necessitating order of 100 bar for filling holes 10 with 100 nm diameter. In practice, this restriction could be relieved by coating the walls of the holes 10 with a thin lining layer that wets the molten filing material.

The effect of viscous force can be estimated by assuming that a steady flow develops momentarily at t=0 (i.e. ignore inertial force). Then the liquid filling material will travel, before it solidifies, to a critical depth having order of $$L_{c1} = \phi \sqrt{\frac{P_{eff}\tau}{\mu}}$$

where $P_{eff}$ is the effective pressure (order of 10 bar) taking into account the surface tension, $\mu$ is the viscosity, and $\tau$ is the melting duration (~100 ns) at the propagating plug front that depends on the thermal diffusivity D ($=\kappa/\rho Cp$, with $\kappa$ as thermal conductivity, Cp as specific heat and $\rho$ as density) and the laser pulse duration tp. Due to the low viscosity of liquid Cu and Si that is comparable to that of water, the theoretical filling depth $L_{c1}$ is calculated to be several μm, one order higher than the hole depth in the experiment.

Similarly, the effect of inertial force, which decides how fast the steady flow develops, can be estimated by assuming an inviscid liquid ($\mu=0$). The corresponding critical filling depth has order of:

$$L_{c2} = \phi \sqrt{\frac{P_{eff}}{\rho}\tau}$$

$L_{c2}$ is estimated to be several μm, the same range as $L_{c1}$. Therefore, both the viscous and the inertial force is important in determining the maximum filling depth.

As for substrate heating, an upper limit of the maximum temperature experienced at the supposed dielectric/semiconductor interface can be estimated as following: For a homogeneous material, the maximum temperature reached at depth equal to its characteristic heat diffusion length $\delta$ ($=2\sqrt{Dtp}$) is roughly ⅕ that of the maximum temperature experienced at the top surface. Now suppose that the dielectric material below depth $\delta$ is replaced by a semiconductor (i.e. assume dielectric thickness equal to $\delta$, or 260 nm for SiO$_2$) that conducts heat better, then the maximum temperature at the dielectric/semiconductor interface would be <⅕ that of the maximum temperature at the dielectric surface, or 400 oC if assuming a maximum surface temperature of 2000° C.;

and the heating lasts for only order of 10 tp (=200 ns here). As a consequence, unlike tungsten CVD, the via hole filling by LADI would have a negligible thermal budget.

Besides superior step coverage and negligible thermal budget, the current technique is fast and simple and doesn't need a seed layer. Its disadvantage, as compared to tungsten CVD, lies in the challenge to scale up due to the likely high pressure required to overcome the surface tension, and the availability of high power pulsed laser having wafer-size power uniformity.

Figure 5A:
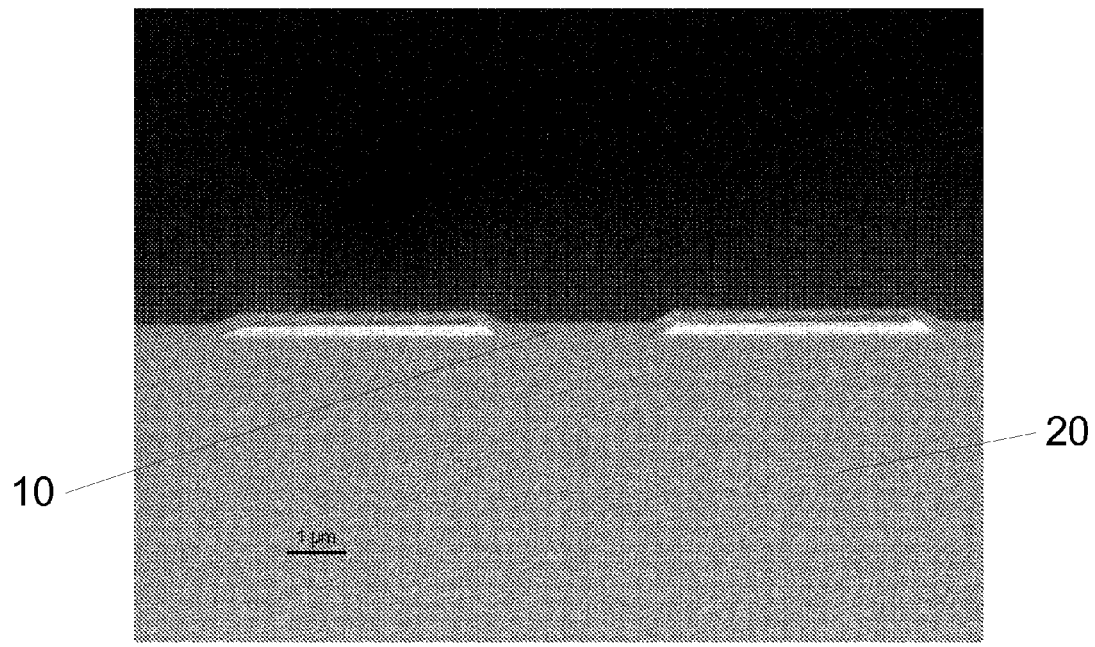
FIGS. 5A and 5B illustrate scanning electron micrographs of (a) a material (silicon) is deposited on a non-planar surface of SiO2 grating (bright part) before the melting and pressing, and (b) after the melting and pressing, the Si filled the gaps between the SiO2 trenches and the top surface is planarized.
Figure 5B:
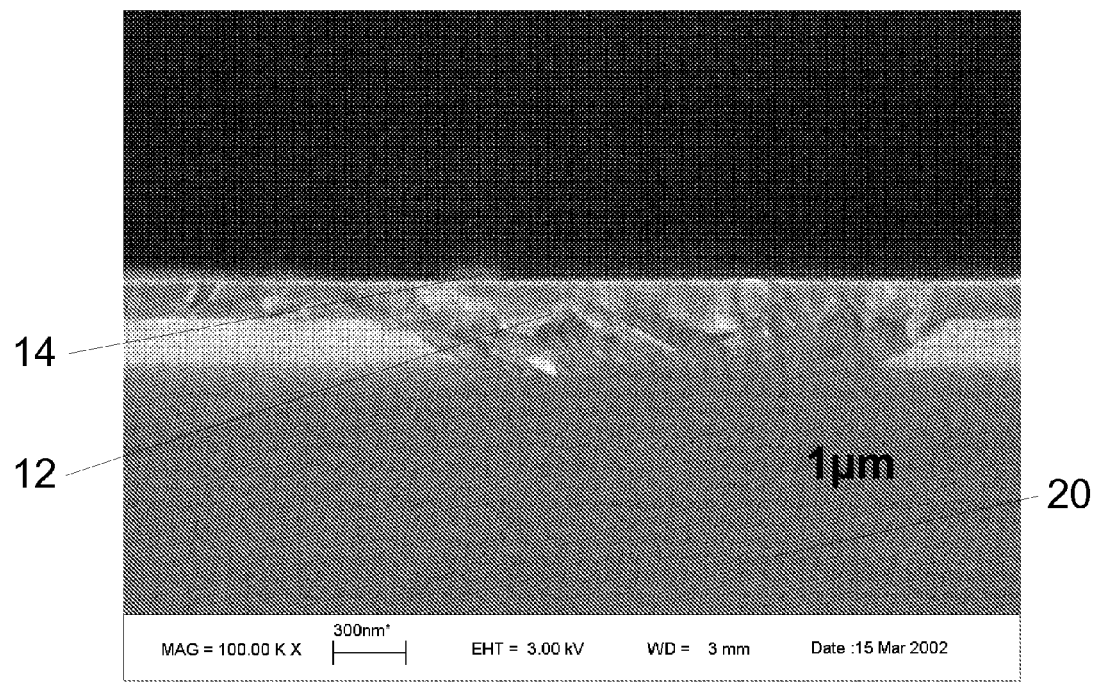

In a second example of the method of the present invention for wafer planarization of a surfaces 14 with relative large variation of topology, SiO$_2$ gratings of different periods (5 to 30 microns) were on the a silicon wafer to create a non-planar surface and followed by deposition of amorphous Si. Then the amorphous Si was planarized by the flat mold 18 press and melt using an excimer laser pulse 22, as shown in FIGS. 5A and 5B (before and after the process).

It may now be seen that one aspect of the invention is a method of making a product having at least one nanoscale feature comprising the steps of: (1) providing a substrate 20 of a first material having a first surface including at least one recessed region 10; (2) coating at least the portion of the first surface comprising the recessed region with a thin layer of a meltable second material 12; (3) providing a mold 18 having a molding surface; (4) pressing together the mold 18 and the substrate 20 with the molding surface pressing the layer of meltable second material 12; and (5) while the molding surface is pressing the layer of meltable second material 12, exposing the layer of meltable second material to radiation 22 to melt the layer 12, thereby increasing the penetration of the meltable second material 12 into the recessed region 10 of the substrate 20. Advantageously, the recessed region 10 has at least one minimum lateral dimension of less than 200 nanometers.

In one advantageous embodiment the substrate 20 comprises an insulating material with the recessed region 10 located in the insulating material and the second fill material 12 comprises a conductive material. The substrate 20 can also advantageously comprise a semiconductor material.

The radiation 22 can be pulsed radiation, laser radiation, or advantageously pulsed laser radiation, preferably in the ultraviolet (UV) range. Preferably, the laser radiation is of short time duration to minimize thermal burden on the substrate 20.

The mold 18 is advantageously substantially transparent to the radiation 22 so that the thin film of fill material 12 can be exposed through the mold 18. A preferred mold material is quartz or fused silica. Alternatively, the substrate 20 could be transparent to the radiation 22 for exposure through the substrate 20.

The second fill material 12 can be any meltable material but is advantageously metal or semiconductor. Preferred second fill materials 12 include copper (Cu) and silicon (Si).

The mold 18 preferably has very smooth, substantially planar molding surface. It can have tiny molding features, but preferably has a mirror smooth, optically smooth surface to precisely planarize the thin film 12.

The recessed regions 10 in the substrate 20 can be any desired recessed regions. Advantageously is is a nanoscale recessed region having at least one minimum lateral dimension less than about 200 nanometers. Advantageously recessed features 10 include holes with effective diameters of less than 200 nanometers and trenches with widths of less than 200 nanometers. The holes can be spaced apart in a one or two dimensional array. Trenches can be spaced apart, as in a parallel array.

A second aspect of the invention is the product made by the above described process. The product has unique advantageous of high-aspect-ratio fill of any detailed cross-section with low thermal burden.

The present disclosure can be embodied in-part in the form of computer-implemented processes and apparatuses for practicing those processes. The present disclosure can also be embodied in-part in the form of computer program code containing instructions embodied in tangible media, such as floppy diskettes, CD-ROMs, hard drives, or an other computer readable storage medium, wherein, when the computer program code is loaded into, and executed by, an electronic device such as a computer, micro-processor or logic circuit, the device becomes an apparatus for practicing the present disclosure.

The present disclosure can also be embodied in-part in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the present disclosure. When implemented in a general-purpose microprocessor, the computer program code segments configure the microprocessor to create specific logic circuits.

As various changes could be made in the above constructions without departing from the scope of the disclosure, it is intended that all matter contained in the above description or shown in the accompanying drawings shall be interpreted as illustrative and not in a limiting sense.

The invention claimed is:

1. A method of making a product having at least one nanoscale feature comprising the steps of:
   providing a substrate of a first material having a first surface including at least one recessed region;
   coating at least the portion of the first surface comprising the recessed region with a thin layer of a meltable second material;
   providing a mold having a molding surface;
   pressing together the mold and the substrate with the molding surface pressing the layer of meltable second material; and
   while the molding surface is pressing the layer of meltable second material, exposing the layer of meltable second material to radiation to melt the layer, thereby increasing the penetration of the meltable second material into the recessed region of the substrate.

2. The method of claim 1 wherein the molding surface is substantially planar; and wherein the pressing and exposing planarize the thin layer.

3. The method of claim 1 wherein the substrate comprises an insulating region, the at least one recessed region is located in the insulating region and the meltable second material comprises a conductive material.

4. The method of claim 1 wherein the substrate comprises a semiconductive material.

5. The method of claim 1 wherein the radiation comprises laser radiation.

6. The method of claim 1 wherein the mold is substantially transparent to the radiation.

7. The method of claim 6 wherein the radiation comprises the laser radiation.

8. The method of claim 1 wherein the substrate is substantially transparent to the radiation.

9. The method of claim 8 wherein the radiation comprises laser radiation.

10. The method of claim 1 wherein the radiation comprises pulsed laser radiation.

11. The method of claim 1 wherein the radiation comprises ultraviolet radiation.

12. The method of claim 1 wherein the meltable second material comprises semiconductor material.

13. The method of claim 12 wherein the semiconductor material comprises silicon.

14. The method of claim 1 wherein the meltable second material comprises metal.

15. The method of claim 14 wherein the metal comprises copper.

16. The method of claim 1 wherein the molding surface is optically smooth.

17. The method of claim 1 wherein the at least one recessed region comprises a periodic array of recessed regions.

18. The method of claim 1 wherein the coating comprises physical vapor deposition.

19. The method of claim 18 wherein the physical vapor deposition comprises electron beam evaporation.

20. The method of claim 1 wherein the recessed feature has an aspect ratio of at least 5 to 1.

21. The method of claim 1 wherein the mold comprises silicon.

22. The method of claim wherein the exposing to radiation comprises exposing to laser radiation in a substantial vacuum.

23. The method of claim 1 wherein the exposure to radiation comprises exposure to laser radiation of short duration to reduce thermal burden.

24. The method of claim 1 wherein the at least one recessed region comprises a trench with a minimum width of less than 200 nanometers.

25. The method of claim 1 wherein the at least one recessed region comprises a hole with a minimum effective diameter of less than 200 nanometers.

26. The method of claim 1 wherein the at least one recessed region comprises a plurality recessed regions each having at lest one lateral feature with a minimum dimension of less than 200 nanometers.

27. The method of claim 26 wherein the plurality of recessed regions comprises a plurality of substantially parallel trenches.

28. The method of claim 26 wherein the plurality of recessed regions comprises a plurality of spaced apart holes.

* * * * *

UNITED STATES PATENT AND TRADEMARK OFFICE
CERTIFICATE OF CORRECTION

| | | |
|---|---|---|
| PATENT NO. | : 7,510,946 B2 | Page 1 of 1 |
| APPLICATION NO. | : 11/533323 | |
| DATED | : March 31, 2009 | |
| INVENTOR(S) | : Stephen Y. Chou, Bo Cui and Chris Keimel | |

It is certified that error appears in the above-identified patent and that said Letters Patent is hereby corrected as shown below:

Please replace Col. 1 lines 11-13 with the following:

"This invention was made with government support under Grant No. N66001-98-1-8900 awarded by the Defense Advanced Research Project Agency (DARPA). The government has certain rights in the invention."

Signed and Sealed this

Second Day of June, 2009

JOHN DOLL
*Acting Director of the United States Patent and Trademark Office*